United States Patent [19]

Marion et al.

[11] Patent Number: 5,107,078
[45] Date of Patent: Apr. 21, 1992

[54] ELECTRIC CONNECTION OR DISCONNECTION ELEMENT, INTEGRATED CIRCUIT INCLUDING SUCH ELEMENTS AND THE CORRESPONDING CONNECTION OR DISCONNECTION METHOD

[75] Inventors: François Marion, Egreve; Michel Ravetto, Seyssinet-Pariset, both of France

[73] Assignee: Commissariat a l'Energie Atomique, Paris, France

[21] Appl. No.: 569,397

[22] Filed: Aug. 17, 1990

[30] Foreign Application Priority Data

Aug. 18, 1989 [FR] France ............................ 89 11013

[51] Int. Cl.⁵ ............................................ H05K 1/00
[52] U.S. Cl. ................................. 174/254; 174/261; 174/257
[58] Field of Search ................. 174/254, 257, 261; 361/400, 397; 337/405

[56] References Cited

U.S. PATENT DOCUMENTS

| | | | |
|---|---|---|---|
| 3,528,048 | 9/1970 | Kirk | 174/254 |
| 3,766,308 | 10/1973 | Loro | 174/254 |
| 4,550,357 | 10/1985 | Matsumoto | 361/400 |
| 4,652,848 | 3/1987 | Hundrieser | 337/405 |
| 4,814,283 | 3/1989 | Temple et al. | 29/851 |

FOREIGN PATENT DOCUMENTS 0078165  5/1983  European Pat. Off. .
3638799  5/1987  Fed. Rep. of Germany .

OTHER PUBLICATIONS

Patent Abstracts of Japan, vol. 8, No. 176, and JP 5969961 (Takegawa).

*Primary Examiner*—Leo P. Picard
*Assistant Examiner*—Trinidad Korka
*Attorney, Agent, or Firm*—Michael N. Meller

[57] ABSTRACT

An electric connection of disconnection element is described as well as the corresponding connection or disconnection method and integrated circuits using such elements.

The disconnection element consists of a disk or ingot joining two conductive tracks whose extremities are laid on wettable surfaces. Melting of the disk frees surface tension forces which separate its material into two balls centered on the wettable surfaces.

The connection element is formed of two separate disks and, from the wettable surface pads, these disks are disposed opposite each other so that their material, once melted, unites to form a single droplet.

A process is also disclosed for using these connection and disconnection elements for repairing defective integrated circuits.

2 Claims, 4 Drawing Sheets

ELECTRIC CONNECTION OR DISCONNECTION ELEMENT, INTEGRATED CIRCUIT INCLUDING SUCH ELEMENTS AND THE CORRESPONDING CONNECTION OR DISCONNECTION METHOD

FIELD OF THE INVENTION

The invention concerns an electric connection or disconnection element, as well as an integrated circuit including such elements and a method for connecting or disconnecting these elements.

BACKGROUND OF THE INVENTION

More particularly, the invention concerns the irreversible electric connection or disconnection between two conductive tracks laid on an integrated circuit support. Up until now, the most commonly used techniques to establish a disconnection consist of cutting a conductive link between the tracks by means of the energy of a laser (flash) and, so as to establish additional connections, consist of locally depositing a conductive material by using a mask (anti-flash).

SUMMARY OF THE INVENTION

The invention renders it much easier to carry out electric connections and disconnections. It uses the surface tension properties of certain materials in their liquid state, such as indium, generally used to set up connections and disconnections.

The electric disconnection between two conductive tracks laid on an integrated circuit support includes two surfaces able to be wetted by an electric conductive material heated to its liquid state, each surface being laid on one track, as well as a connection disk extending between the tracks and, at two extreme and opposing zones, on the wettable surfaces, the disk being made from the conductive material.

The connection element includes on each track a surface able to be wetted by an electric conductive material brought to its liquid state, as well as one disk made from the conductive material, the disks each including one extreme zone on one of the wettable surfaces and extending from this extreme zone in a direction opposite the other wettable surface.

These elements are used by virtue of two complementary aspects of a given phenomenon, but the disconnection or connection method with the aid of these elements is identical: it consists of melting the disks by heating them and of then allowing them to cool and solidify.

BRIEF DESCRIPTION OF THE DRAWINGS

There now follows a more detailed description of the invention with the aid of the following accompanying figures, given by way of illustration and being in no way restrictive.

DETAILED DESCRIPTION OF THE PREFERRED EMBODIMENTS

Figure 1:
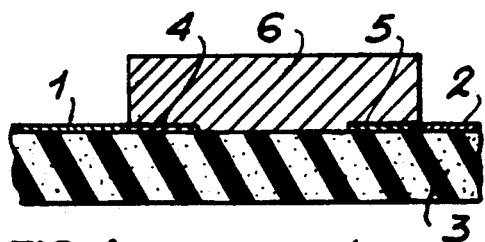
FIGS. 1 and 2 represent a side view and a top view of a disconnection element.
Figure 2:
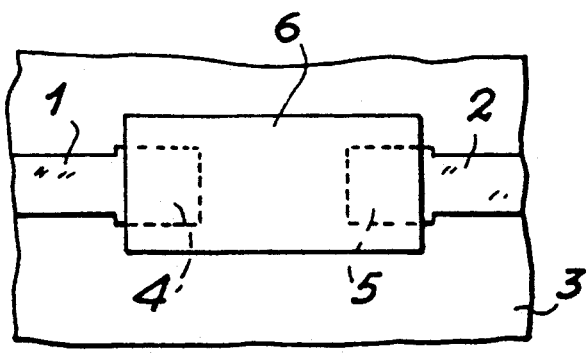

FIGS. 1 and 2 show two electric conductive tracks 1 and 2 on a support 3 able to carry one or more integrated circuits. The tracks 1 and 2 end face-to-face and are provided at their extremity with a gold film 4 and 5. One indium disk 6 connects the two tracks 1 and 2 by extending them; the two extremities of the disk 6 rest on the films 4 and 5. The upper face of the disk 6 opposite the support 3 is flat.

The disk 6 has been obtained, for example, by depositing with a mask. FIG. 2 shows a rectangular disk 6, but it is possible to use disks with other shapes.

So as to cease the electric connection established by the disk 6 between the tracks 1 and 2, it merely suffices to heat the disk 6 until it has melted. In its liquid state, the surface tension forces modify the shape of the disk 6. As gold is a wettable material for the indium, it can be observed that the droplet obtained by melting the disk 6 tends to spread over the films 4 and 5. The droplet thus expands, its material moving slightly towards the left of the film 4 located on the left and towards the right of the film 5 located to the right on the drawing. A contraction of the droplet finishes by being produced, then is totally separated and finally (FIG. 3) two indium balls 7 and 8 are obtained respectively centered on the films 4 and 5 and in the shape of truncated spheres at the location of these films 4 and 5. The connection between the tracks 1 and 2 is definitively broken.

The support 3 is left to cool; the balls 7 and 8 solidify without changing shape.

Figure 4:
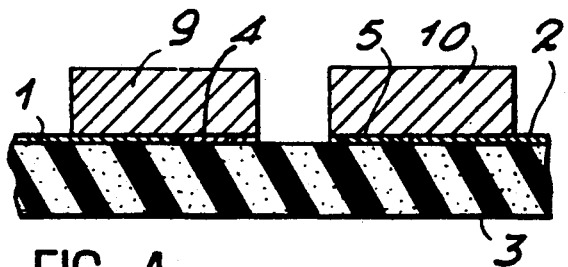
FIGS. 4 and 5 represent a top view of a connection element.
Figure 5:
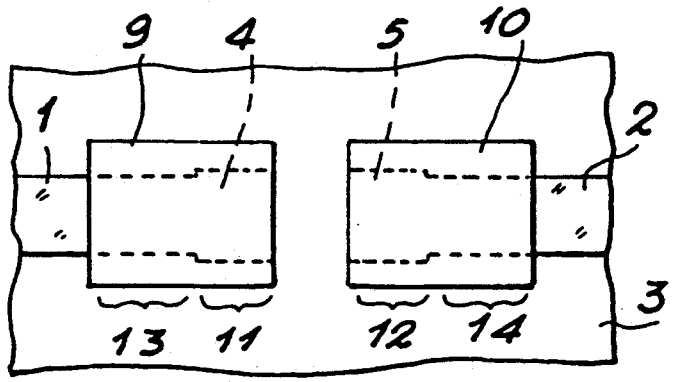

The support 3 and the films 4 and 5 are found on the tracks 1 and 2, as shown on FIGS. 4 and 5. The connection element is composed of two separate plain indium disks 9 and 10 each having one extremity section respectively 11 and 12 disposed on the film 4 or 5, and one additional section, respectively 13 and 14, adjacent to the extremity section 11 or 12 and extending from the latter in a direction opposite the other film, respectively 5 and 4.

Figure 6:
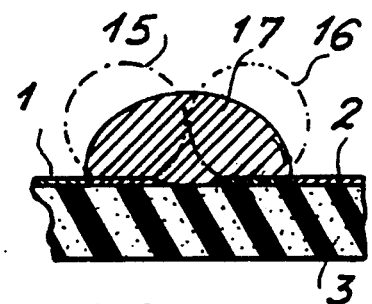
FIG. 6 represents the same element after connection.

So as to establish the electric connection between the tracks 1 and 2, the disks 9 and 10 are heated until they melt. The freed surface tension forces rearrange the material of the disks 9 and 10 into two truncated balls 15 and 16 (FIG. 6) similar to those of FIG. 3, but in this instance their volumes are sufficiently large so that they join together. The modification of the surface tension forces resulting from this joining leads to coalescence of the two balls 15 and 16 into a single droplet 17 which thus now unites the tracks 1 and 2 and provides an electric connection. As in the case with the disconnection element, the droplet 17 is then left to cool and solidify.

The use of such connection and disconnection elements is possible on a large device bearing the elementary integrated circuits to be interconnected, such as aligned memories and where there is a need to verify the integrated circuits one after the other so as to replace them when they are found to be defective.

Figure 7:
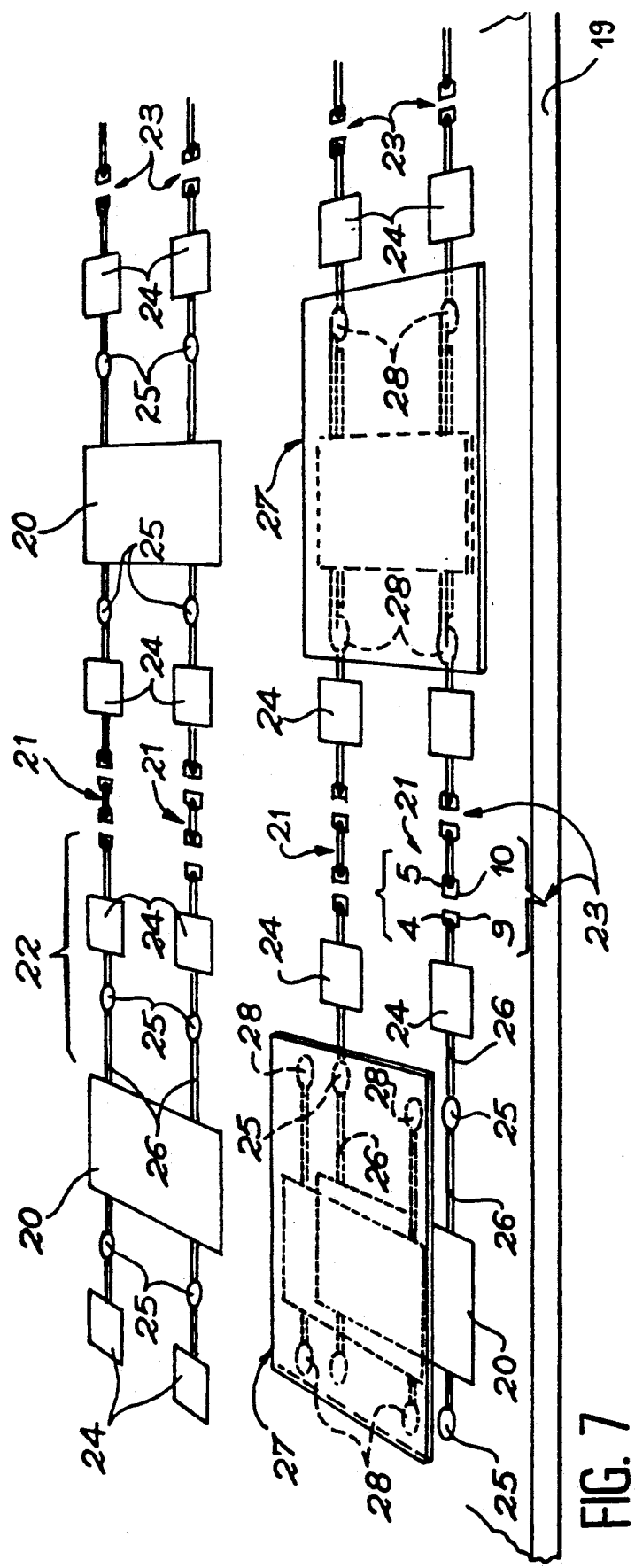
FIG. 7 represents a device with integrated circuits and provided with connection and disconnection elements.

The large device includes (FIG. 7) on a support 19 integrated circuits 20 connected to connection lines 22. Interconnection lines 21 extend between the integrated circuits 20 and their extremities end close to the extremities of the connection lines 22 so that the interconnection lines 21 lengthen the connection lines 22.

Figure 3:
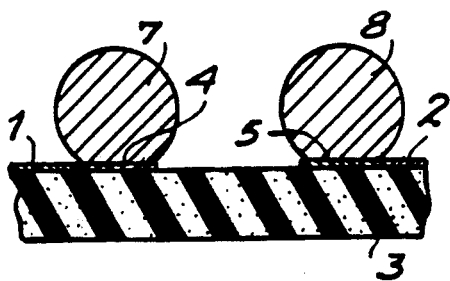
FIG. 3 represents the same element after disconnection.

Connection elements 23, similar to those of FIGS. 3 and 4, are laid on the extremities of the interconnection 21 and connection 22 lines, which thus correspond to the tracks 1 and 2 of these figures. In addition, the connection lines 22 are provided with an element 23 for connection to the integrated circuit 20, a verification block 24 and a welding block 25.

Upon start up, the integrated circuits 20 are thus separated and verification consists of placing the terminals of a measuring device on the verification blocks 24 and of testing the integrated circuits 20 one after the other. The connection elements 23, which have not been melted, prevent electric interference by the interconnection lines 21.

The defective integrated circuits 20 need to be replaced by repair circuits 27 provided with wettable surface pads 28 disposed so as to be opposite the welding blocks 25.

Figure 8:
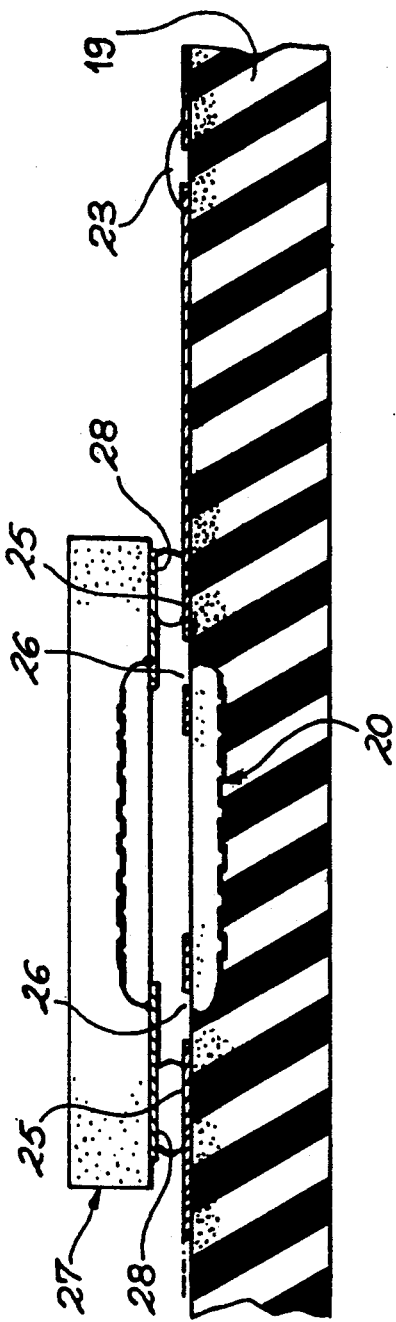
FIG. 8 represents the final state of a repair of the device of FIG. 7.

The connection lines 22 leading to the defective integrated circuits 20 are firstly cut with the laser so as to separate them from the welding blocks 25. The cutting zone is given the reference 26 on FIG. 7. Then the wettable surface pads 28 of the separation circuits 27 are aligned on the welding blocks 25 and then, by heating the device, the indium disks are melted covering the welding blocks 25 which thus wetten the surfaces of pads 28 and, after having solidified, establish a mechanical and electric connection of the repair circuits 27 to the support 19 and to the connection lines 22. The repair circuit 27 covers the elementary circuit 20 without being in contact with the latter, as shown on FIG. 8. During the same overall heating operation, the connection elements 23 reclose, thus joining the correct integrated circuits 20 and the repair circuits 27 between them via the interconnection lines 21.

Figure 9:
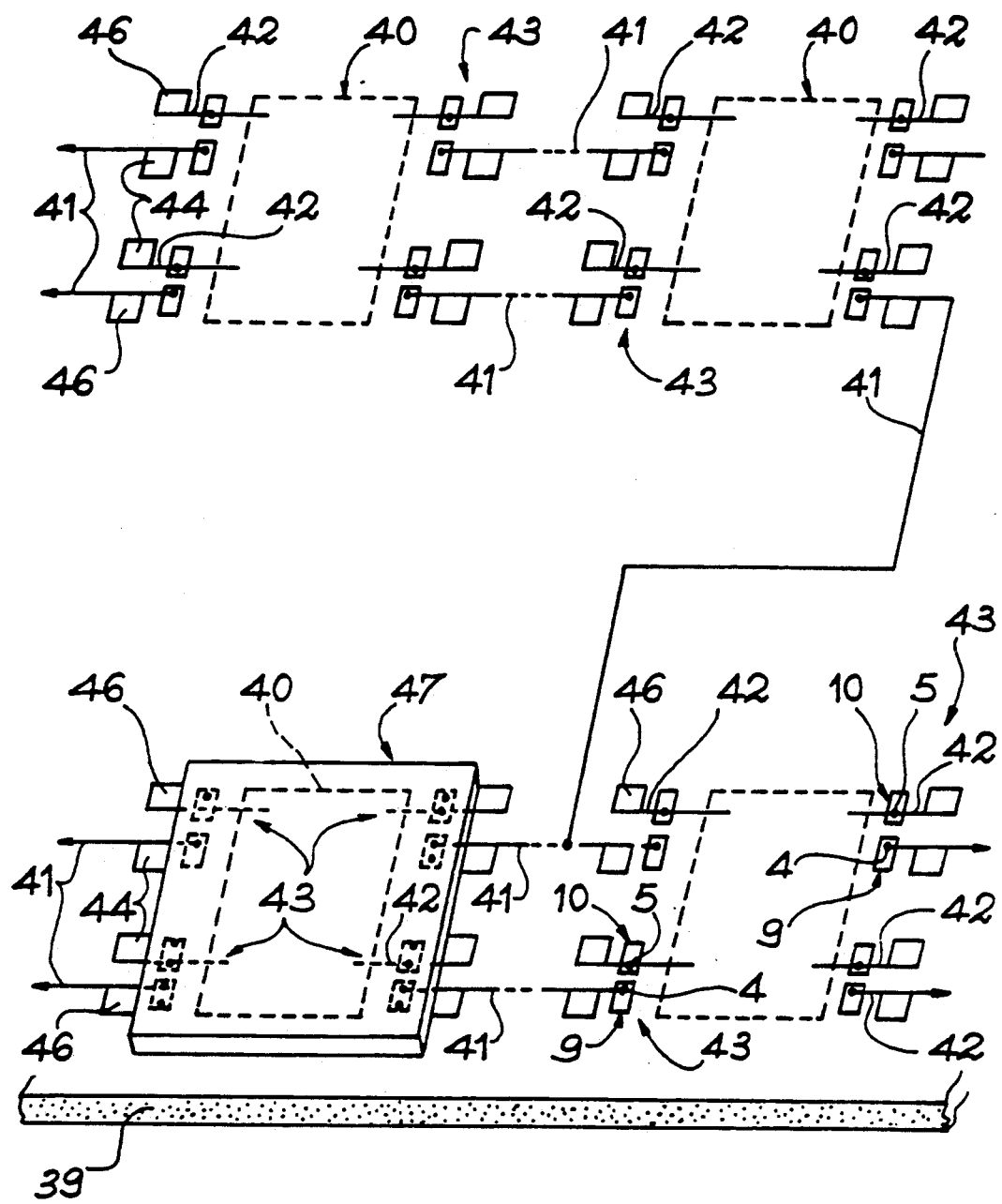
FIG. 9 represents another larger device.

Another device bearing integrated circuits is shown on FIG. 9 and has been designed so as to allow for easier implementation and repair operations. The support is given the reference 39, the integrated circuits the reference 40, the interconnection lines the reference 41 and the connection lines the reference 42; as in the preceding device, the interconnection lines 41 each extend between two integrated circuits 40 but without reaching them, but here the connection lines 42 each extend from one integrated circuit 40 parallel to one associated interconnection line 41 and close to this line 41. The connection elements, referenced here by 43 and established both on one interconnection line 41 and one connection line 42, thus have disks 9 and 10 extending from the films 4 and 5 perpendicular to said lines 41 and 42. In addition, the interconnection lines 41 are provided with verification blocks 44 at each of their extremities and similarly each connection line 42 is ended by one verification block 46.

Figure 10:
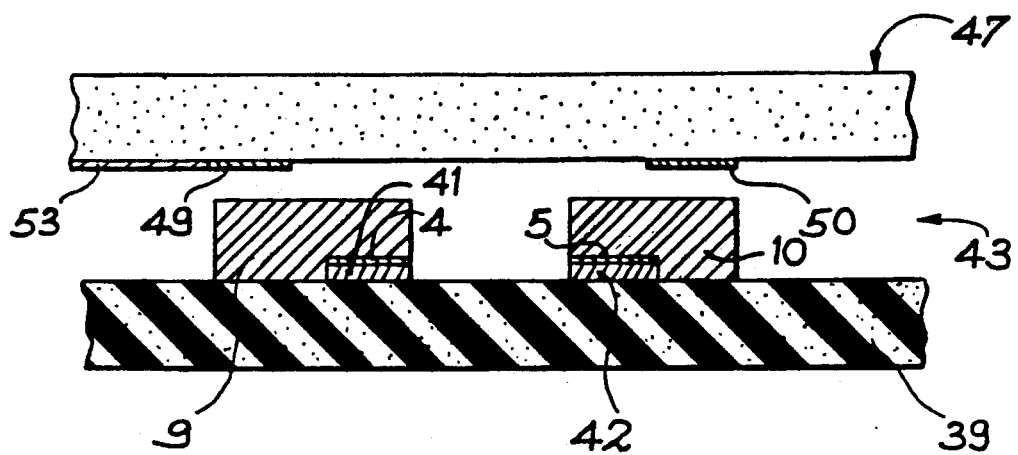
FIGS. 10 and 11 represent two stages of a method to repair the device of FIG. 9.

During a preliminary stage for putting the device into service, the verification blocks 44 and 46 make it possible to respectively control the continuity of the interconnection lines 41 and the sound and proper state of the integrated circuits 40. As for the preceding device, the incorrect integrated circuits 40 are replaced by repair circuits 47 placed above them, but the disposition of the welding zones is different. As can be seen on FIG. 10, the lower face of the repair circuits 47 is provided with pairs of wettable surface pads 49 and 50 situated above the connection elements 43, but the wettable surface pads 49 and 50 of the repair circuit 47 are spaced further apart than the wettable surfaces 4 and 5 on the interconnection line 41 and the connection line 42 and extend above sections of the disks 9 and 10 laid at the side of the lines 41 and 42.

Figure 11:
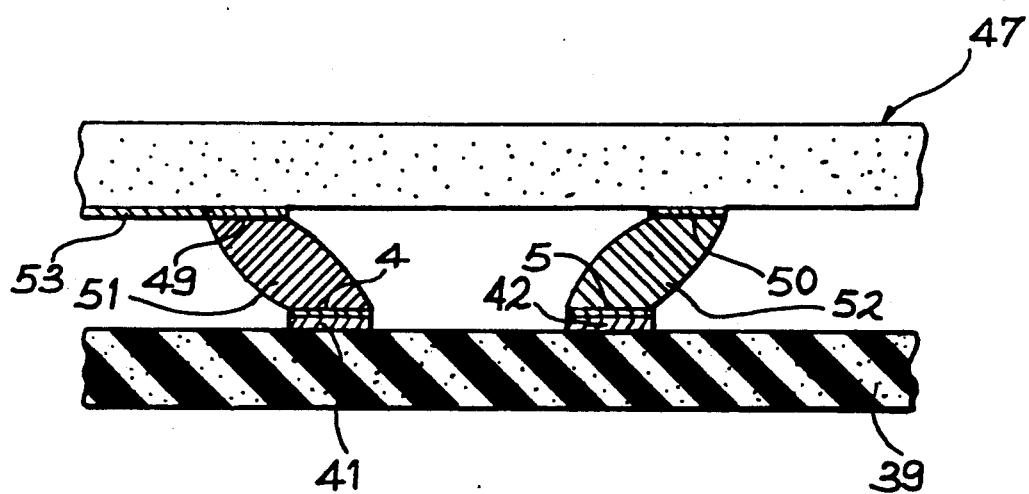

The connections required to put the device into service are obtained by means of a single stage for heating the entire device, which causes the disks of the connection elements 43 to melt. The droplets thus produced freely recover and undergo coalescence when they are not overhung by a repair circuit 47: the phenomenon described here is pictured on FIG. 6 and which thus results in connecting the integrated circuits 40 in repair to the interconnection lines 41. But the situation is different for the connection elements 43 below the repair circuits 47: the droplets are intercepted by the wettable surface pads 49 and 50 of the repair circuit 47 as soon as they recover and spread over them. When solidification occurs, two balls (FIG. 11) 51 and 52 are obtained, each being slanted opposite the other, the first one 51 connecting an interconnection line 41 to a connection line 53 laid below the repair circuit 47 and in contact with the wettable surface 49, whereas the second ball 52 connects the connection line 42 laid on the support device 39 to the wettable surface pads 50, which is electrically isolated from the rest of the repair circuit 47.

The connection elements 43 may also be used as welding elements in this embodiment; the balls 52 not having any electric connection role are nevertheless useful in strengthening the mechanical linking of the repair circuits 47 on the support 39.

Of course, the invention may also be extended to all the materials having similar properties already used in this technique.

What is claimed is:

1. Process for putting into service a device comprising: a substrate; a plurality of integrated circuits placed on said substrate; a plurality of electrical connecting lines placed on said substrate and respectively connecting said integrated circuits; first pads wettable by a soldering material, said first pads being arranged in pairs, the pads of each pair being respectively located on adjacent portions of two different electrical connecting lines; a plurality of flat ingots of said soldering material, each of said ingots respectively covering one of said first pads of said pairs and extending substantially away from the other first pad of the same pair, said process comprising the steps of probing said integrated circuits to find among them deficient circuits; placing repair circuits above said deficient circuits, said repair circuits comprising second electrical connecting lines and second pads wettable by said soldering material, each second pad extending respectively above one of said first pads; heating said substrate so that said ingots of each of said first pads of a pair melt and become droplets that coalesce either with one of said second pads or with the other said first pad of the same pair; and allowing said substrate to cool down and the droplets to solidify.

2. Process according to claim 1, wherein said second pads are arranged in second pairs, the pads of each of said second pairs being spaced further apart than said first pads of said pair below said second pair.

* * * * *